United States Patent
Lin et al.

(10) Patent No.: US 8,445,990 B2
(45) Date of Patent: May 21, 2013

(54) SEMICONDUCTOR DEVICE AND METHOD OF FORMING AN INDUCTOR WITHIN INTERCONNECT LAYER VERTICALLY SEPARATED FROM SEMICONDUCTOR DIE

(75) Inventors: Yaojian Lin, Singapore (SG); Kang Chen, Singapore (SG); Jianmin Fang, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 255 days.

(21) Appl. No.: 12/964,810

(22) Filed: Dec. 10, 2010

(65) Prior Publication Data
US 2012/0146181 A1    Jun. 14, 2012

(51) Int. Cl.
*H01L 27/08* (2006.01)

(52) U.S. Cl.
USPC .................. 257/531; 257/787; 257/E23.011; 257/E21.499; 438/26; 438/118; 438/127

(58) Field of Classification Search
USPC .................. 257/531, 787, E33.059, E23.011, 257/E23.116, E21.499, E21.502; 438/26, 438/106, 118, 127
See application file for complete search history.

(56) References Cited

U.S. PATENT DOCUMENTS

| | | | |
|---|---|---|---|
| 7,233,224 B2 | 6/2007 | Strzalkowski et al. | |
| 2007/0042594 A1* | 2/2007 | Wakabayashi et al. | 438/613 |
| 2009/0236686 A1 | 9/2009 | Shim et al. | |
| 2009/0246909 A1* | 10/2009 | Takeuchi et al. | 438/106 |
| 2009/0261466 A1* | 10/2009 | Pagaila et al. | 257/686 |
| 2010/0052839 A1 | 3/2010 | Mertens et al. | |
| 2010/0059854 A1 | 3/2010 | Lin et al. | |

* cited by examiner

*Primary Examiner* — Matthew Landau
*Assistant Examiner* — Colleen E Snow
(74) *Attorney, Agent, or Firm* — Robert D. Atkins; Patent Law Group: Atkins & Associates, P.C.

(57) ABSTRACT

A semiconductor device has an adhesive layer formed over a carrier. A semiconductor die has bumps formed over an active surface of the semiconductor die. The semiconductor die is mounted to the carrier with the bumps partially disposed in the adhesive layer to form a gap between the semiconductor die and adhesive layer. An encapsulant is deposited over the semiconductor die and within the gap between the semiconductor die and adhesive layer. The carrier and adhesive layer are removed to expose the bumps from the encapsulant. An insulating layer is formed over the encapsulant. A conductive layer is formed over the insulating layer in a wound configuration to exhibit inductive properties and electrically connected to the bumps. The conductive layer is partially disposed within a footprint of the semiconductor die. The conductive layer has a separation from the semiconductor die as determined by the gap and insulating layer.

24 Claims, 17 Drawing Sheets

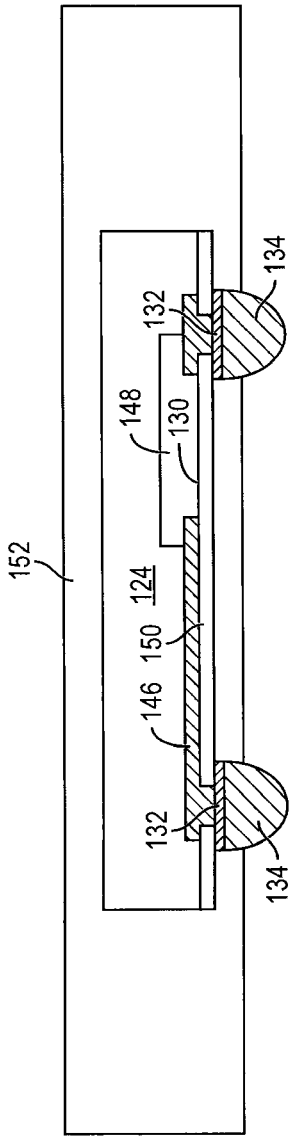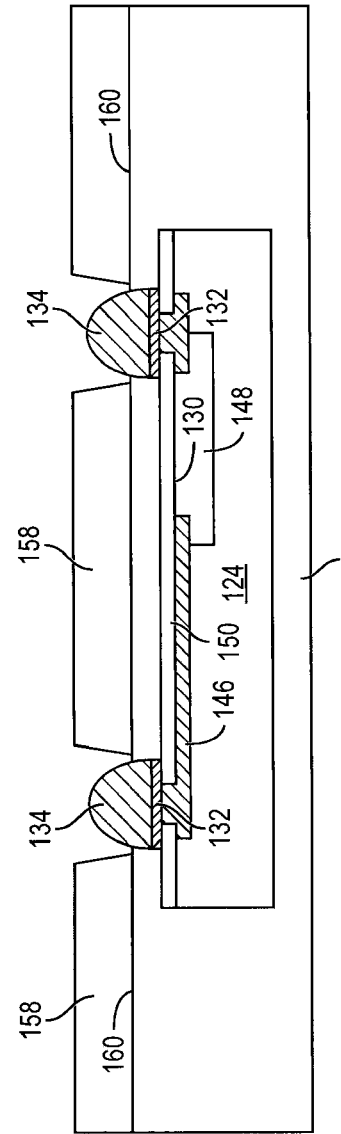

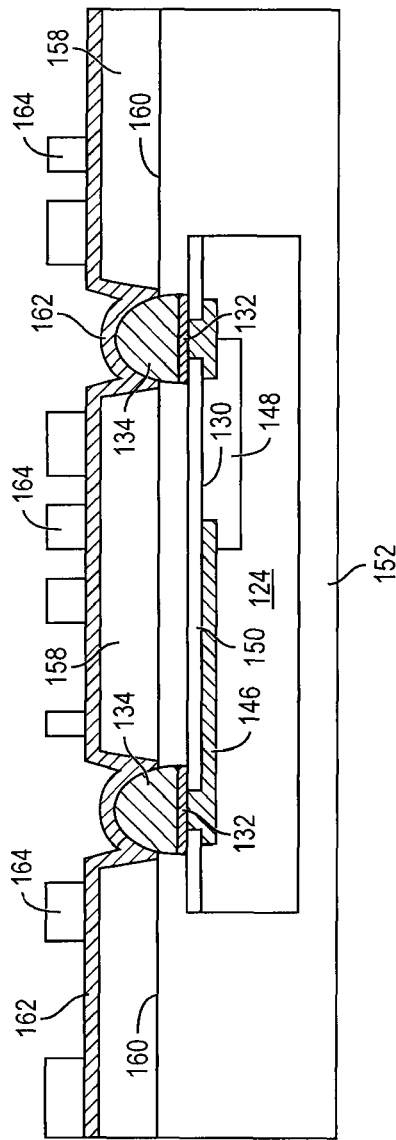
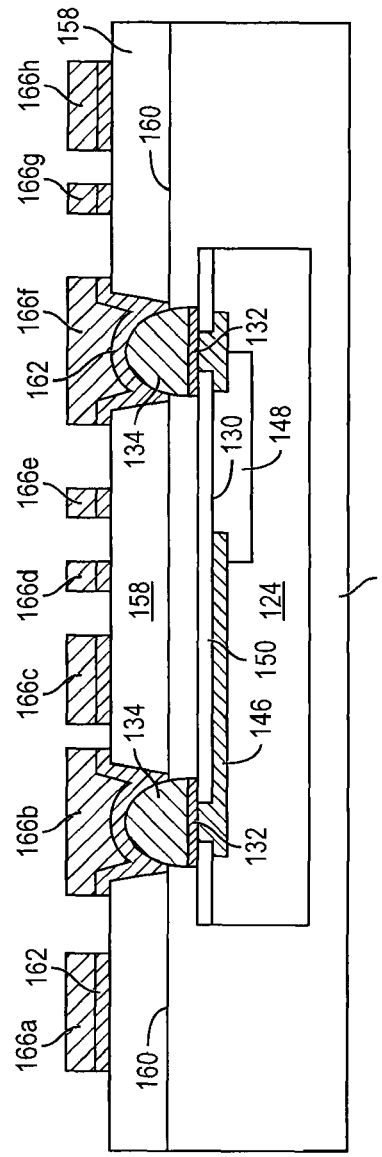
FIG. 4h
FIG. 4i

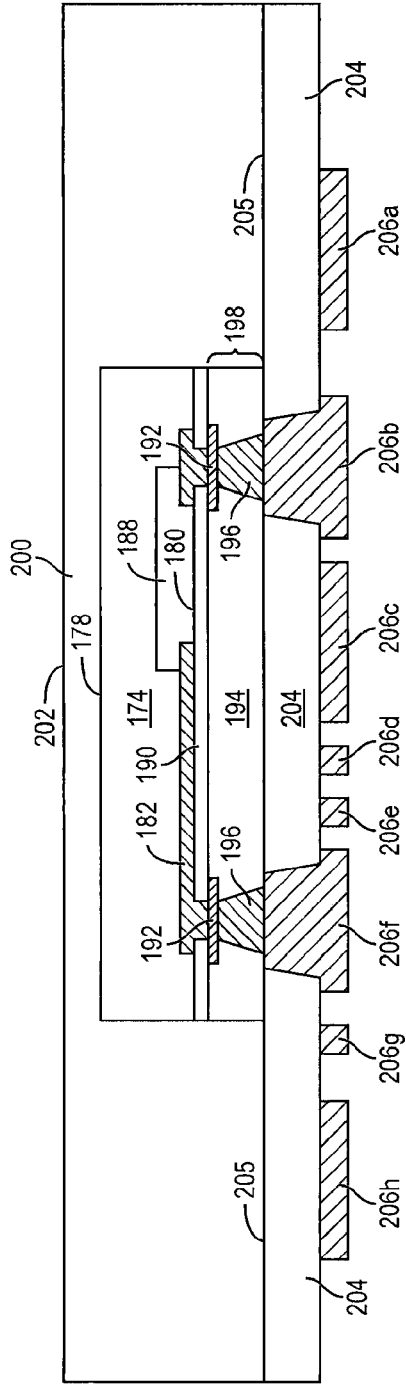
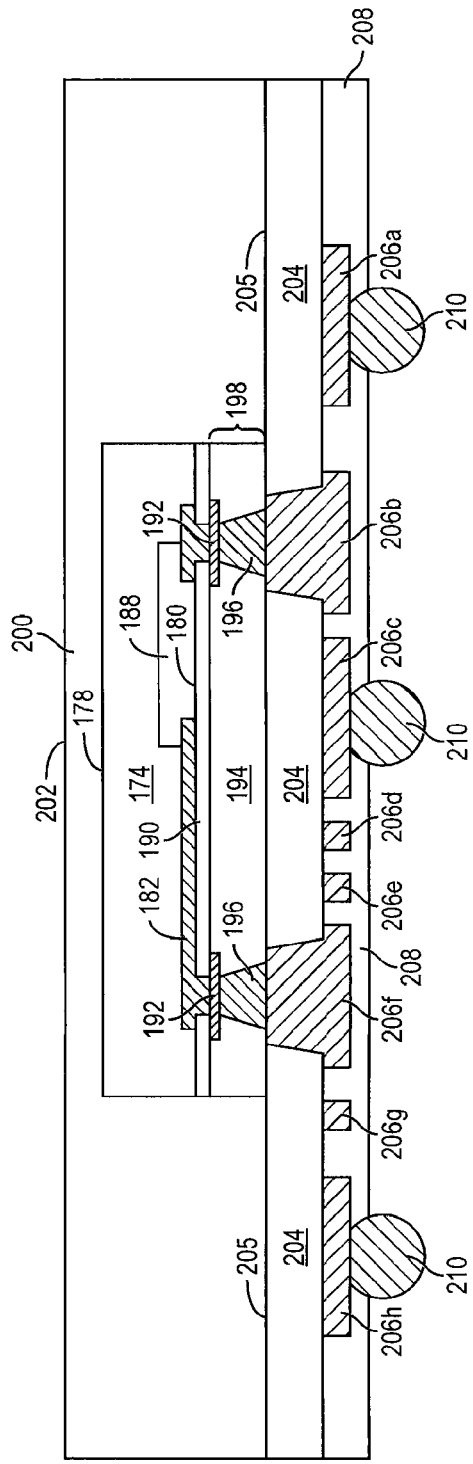

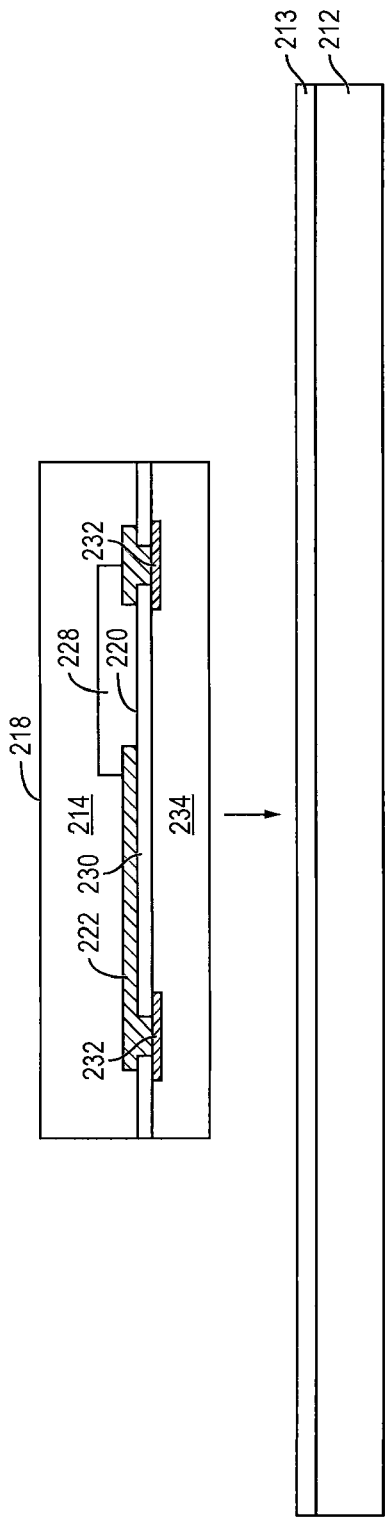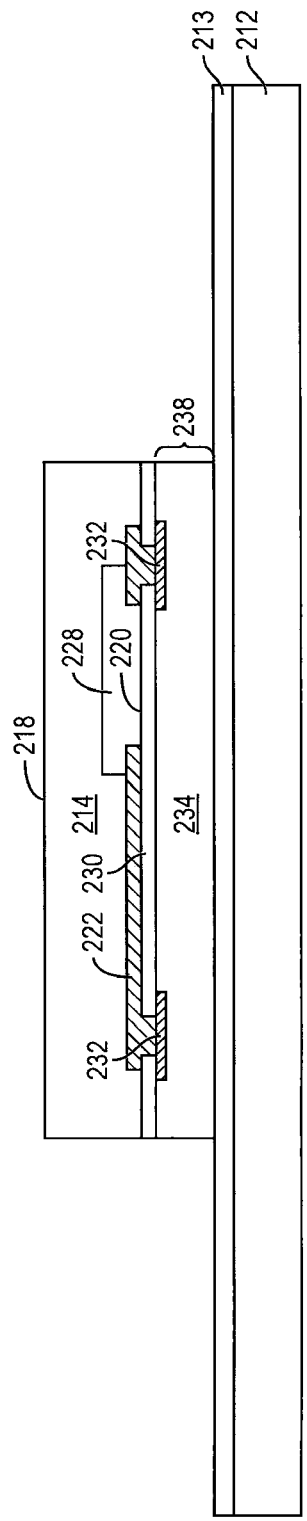
FIG. 6a
FIG. 6b

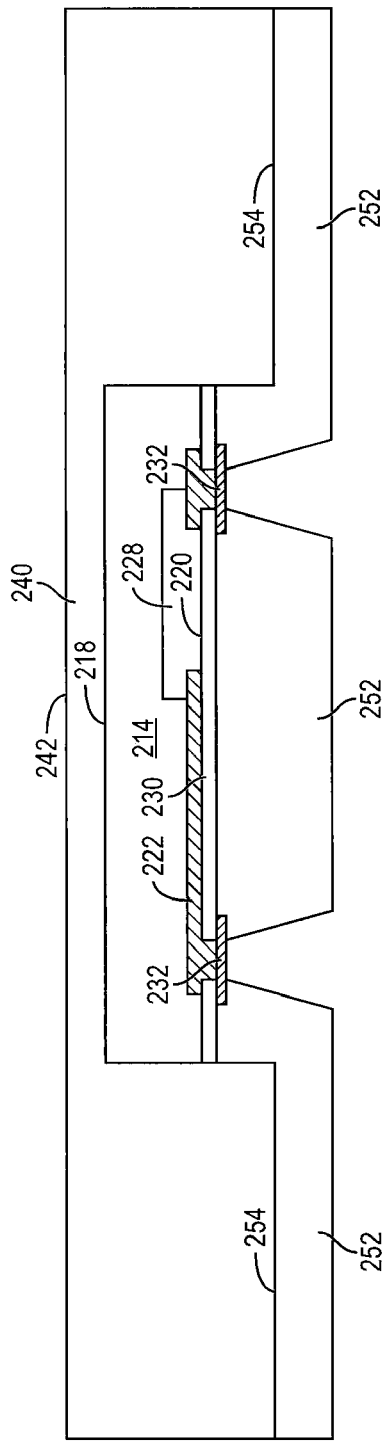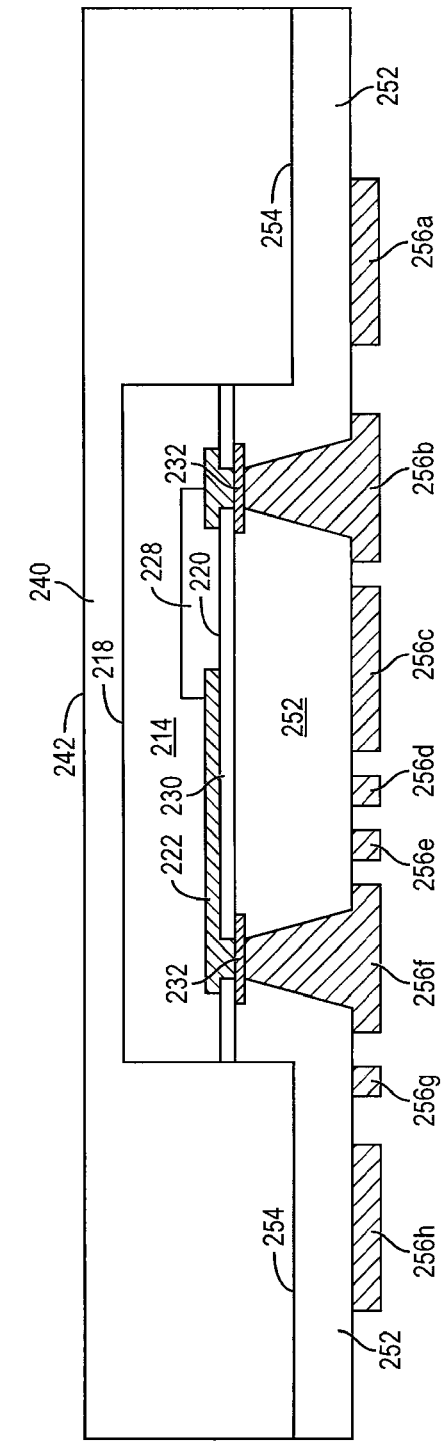

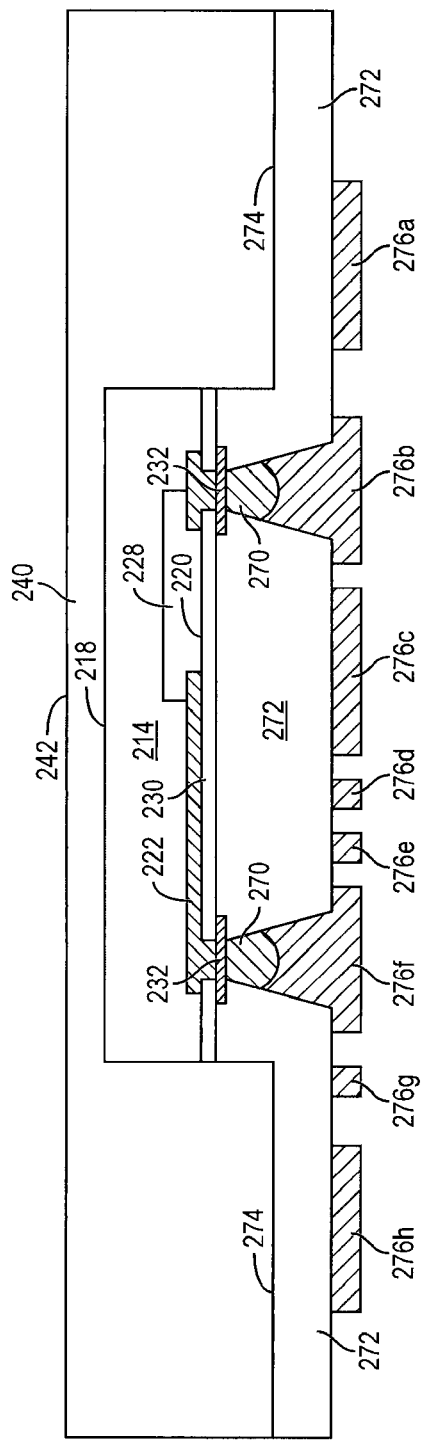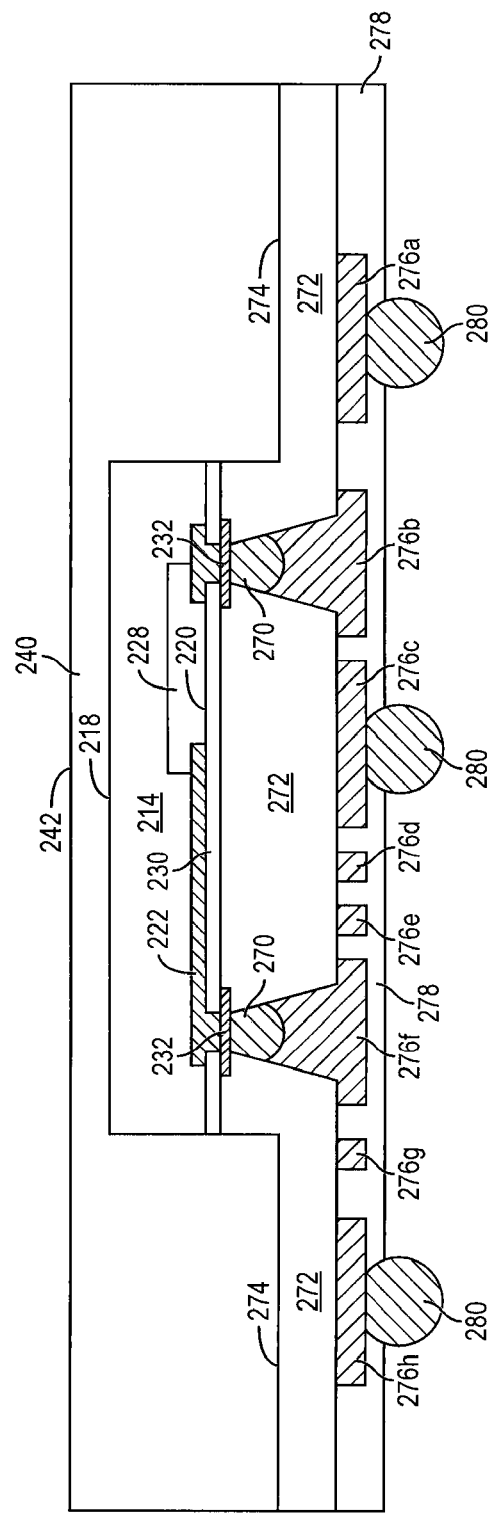

SEMICONDUCTOR DEVICE AND METHOD OF FORMING AN INDUCTOR WITHIN INTERCONNECT LAYER VERTICALLY SEPARATED FROM SEMICONDUCTOR DIE

FIELD OF THE INVENTION

The present invention relates in general to semiconductor devices and, more particularly, to a semiconductor device and method of forming an inductor within an interconnect layer with vertical separation from a semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions.

The inductor can be formed within the semiconductor die. However, integrated die inductors often suffer with low Q factor, due in part to eddy current losses. The integrated inductors consume considerable die area and reduce design flexibility.

SUMMARY OF THE INVENTION

A need exists for a high Q factor inductor within a semiconductor device. Accordingly, in one embodiment, the present invention is a method of making a semiconductor device comprising the steps of providing a carrier, forming an adhesive layer over the carrier, providing a semiconductor die having a plurality of bumps formed over an active surface of the semiconductor die, mounting the semiconductor die to the carrier with the bumps partially disposed in the adhesive layer to form a gap between the semiconductor die and adhesive layer, depositing an encapsulant over the semiconductor die and within the gap between the semiconductor die and adhesive layer, removing the carrier and adhesive layer to expose the bumps from the encapsulant, forming an insulating layer over the encapsulant, and forming a first conductive layer over the insulating layer in a wound configuration to exhibit inductive properties and electrically connected to the bumps. The first conductive layer has a separation from the semiconductor die as determined by the encapsulant within the gap and the insulating layer.

In another embodiment, the present invention is a method of making a semiconductor device comprising the steps of providing a carrier, providing a semiconductor die, forming a first insulating layer over a surface of the semiconductor die, leading with the first insulating layer, mounting the semiconductor die to the carrier, depositing an encapsulant over the semiconductor die, removing the carrier, forming a second insulating layer over the semiconductor die, and forming a first conductive layer over the second insulating layer in a wound configuration to exhibit inductive properties. The first conductive layer has a separation from the semiconductor die as determined by the first and second insulating layers.

In another embodiment, the present invention is a method of making a semiconductor device comprising the steps of providing a semiconductor die, forming a first insulating layer over a first surface of the semiconductor die, depositing an encapsulant over a second surface of the semiconductor die opposite the first surface, forming a second insulating layer over the first surface of the semiconductor die, and forming a first conductive layer over the second insulating layer in a wound configuration to exhibit inductive properties. The first conductive layer has a separation from the semiconductor die.

In another embodiment, the present invention is a semiconductor device comprising a semiconductor die and first insulating layer formed over a first surface of the semiconductor die. An encapsulant is deposited over a second surface of the semiconductor die opposite the first surface. A second insulating layer is formed over the first surface of the semiconductor die. A first conductive layer is formed over the second insulating layer in a wound configuration to exhibit inductive properties. The first conductive layer has a separation from the semiconductor die.

BRIEF DESCRIPTION OF THE DRAWINGS

FIGS. 4a-4k illustrate a process of forming an inductor within an interconnect layer with vertical separation from a semiconductor die;

FIGS. 5a-5f illustrate second embodiment of forming an inductor within an interconnect layer with vertical separation from a semiconductor die;

FIGS. 6a-6g illustrate third embodiment of forming an inductor within an interconnect layer with vertical separation from a semiconductor die; and FIGS. 7a-7e illustrate fourth embodiment of forming an inductor within an interconnect layer with vertical separation from a semiconductor die.

DETAILED DESCRIPTION OF THE DRAWINGS

Figure 1:
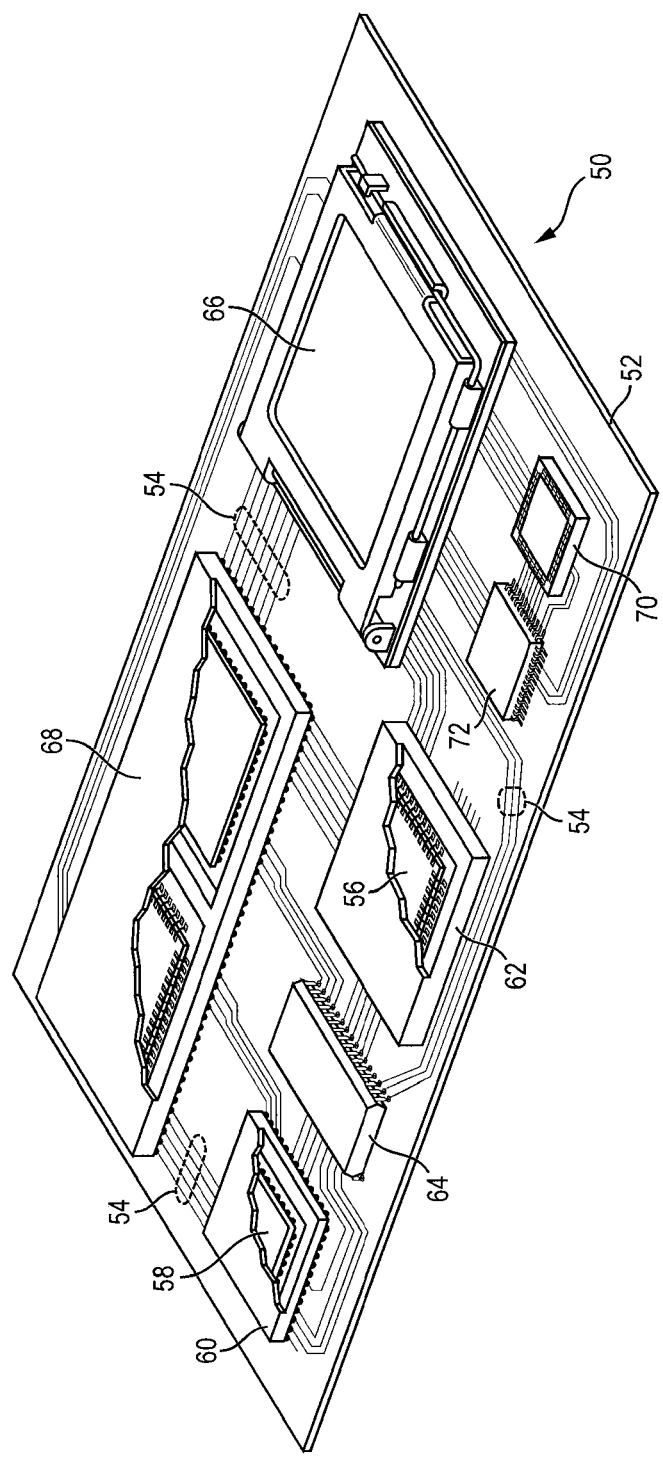
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
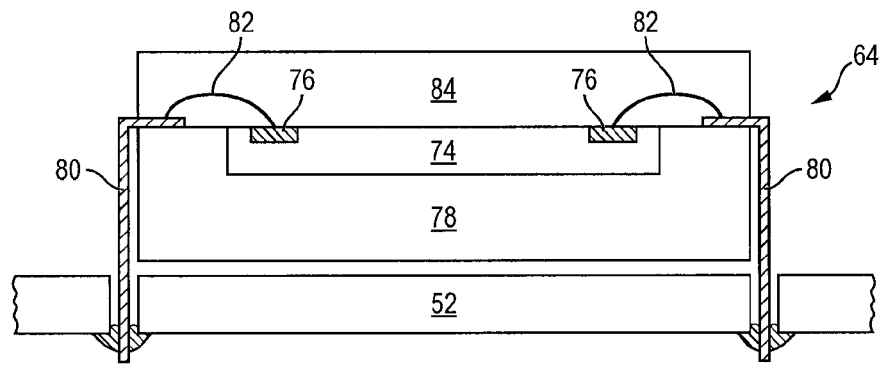
FIGS. 2a-2c illustrate further detail of the semiconductor packages mounted to the PCB.
Figure 2B:
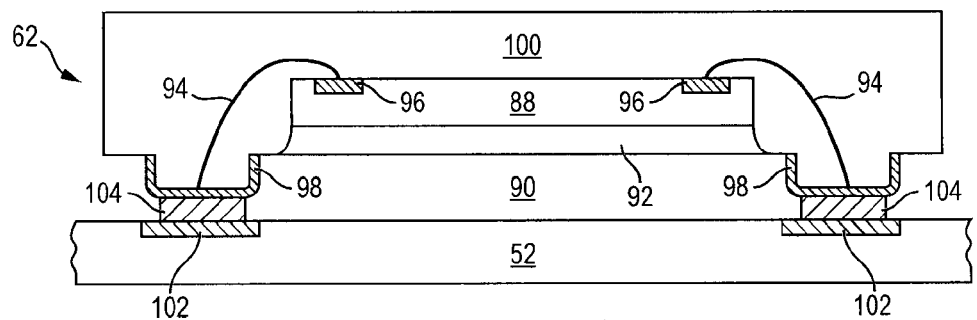
Figure 2C:
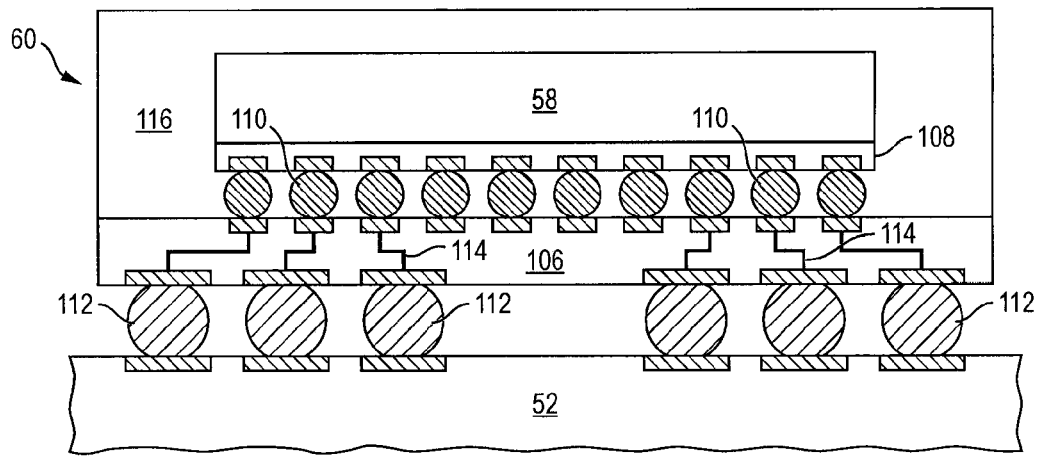

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
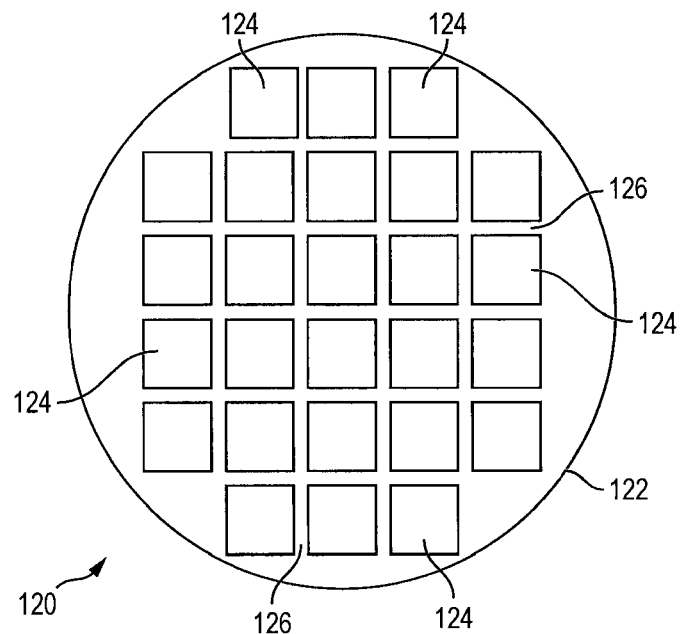
FIGS. 3a-3c illustrate a semiconductor wafer with a plurality of semiconductor die separated by saw streets.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

Figure 3B:
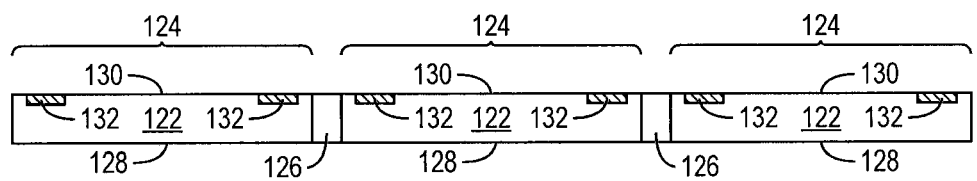

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Bumps 134 are formed on contact pads 132.

Figure 3C:
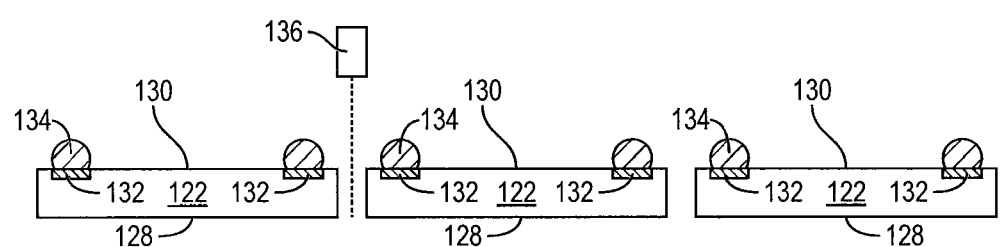

In FIG. 3c, semiconductor wafer 120 is singulated through saw street 126 using a saw blade or laser cutting tool 136 into individual semiconductor die 124.

Figure 4A:
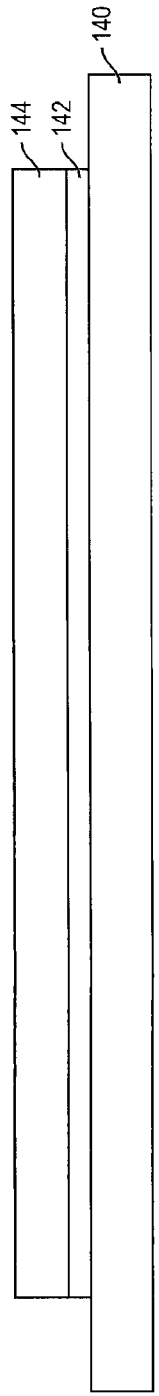

FIGS. 4a-4k illustrate, in relation to FIGS. 1 and 2a-2c, a process of forming an inductor within an interconnect layer with vertical separation from a semiconductor die. FIG. 4a shows a substrate or carrier 140 containing temporary or sacrificial base material such as silicon, polymer, beryllium oxide, or other suitable low-cost, rigid material for structural support. An interface layer or double-sided tape 142 is formed over carrier 140 as a temporary adhesive bonding film or etch-stop layer. A penetrable adhesive layer 144 is formed over interface layer 142. In one embodiment, penetrable adhesive layer 144 is a B-stage material.

Figure 4B:
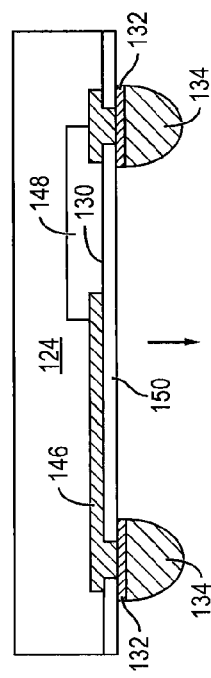
Figure 4C:
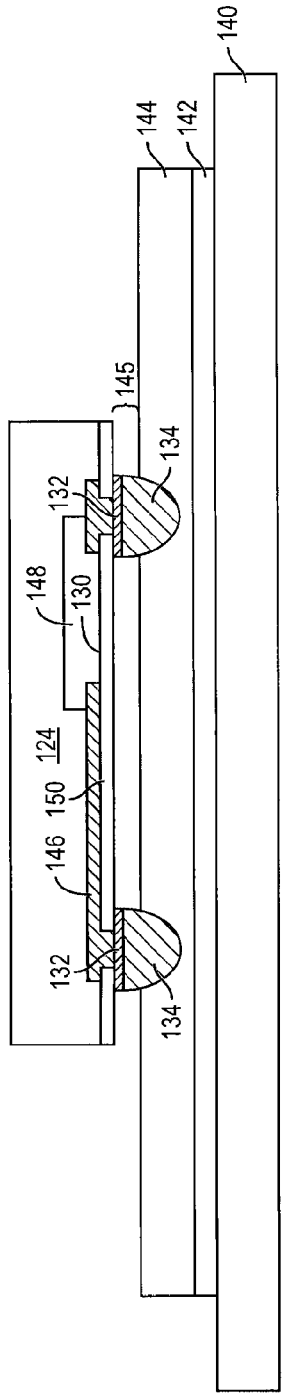

In FIG. 4b, semiconductor die 124 from FIGS. 3a-3c is positioned over and mounted to carrier 140 using a pick and place operation. Bumps 134 are partially embedded within adhesive layer 144 to leave a gap 145 between semiconductor die 124 and adhesive layer 144, as shown in FIG. 4c. In one embodiment, semiconductor die 124 contains an electrically conductive layer 146 (later used as an inductor bridge) and analog and digital circuits 148 as part of active surface 130, as described in FIG. 3b.

An insulating or dielectric layer 150 is formed over active surface 130 and conductive layer 146 of semiconductor die 124 using PVD, CVD, screen printing, spin coating, spray coating, sintering or thermal oxidation. The insulating layer 150 contains one or more layers of silicon dioxide (SiO2), silicon nitride (Si3N4), silicon oxynitride (SiON), tantalum pentoxide (Ta2O5), aluminum oxide (Al2O3), polyimide, benzocyclobutene (BCB), polybenzoxazoles (PBO), or other suitable dielectric material.

Figure 4D:
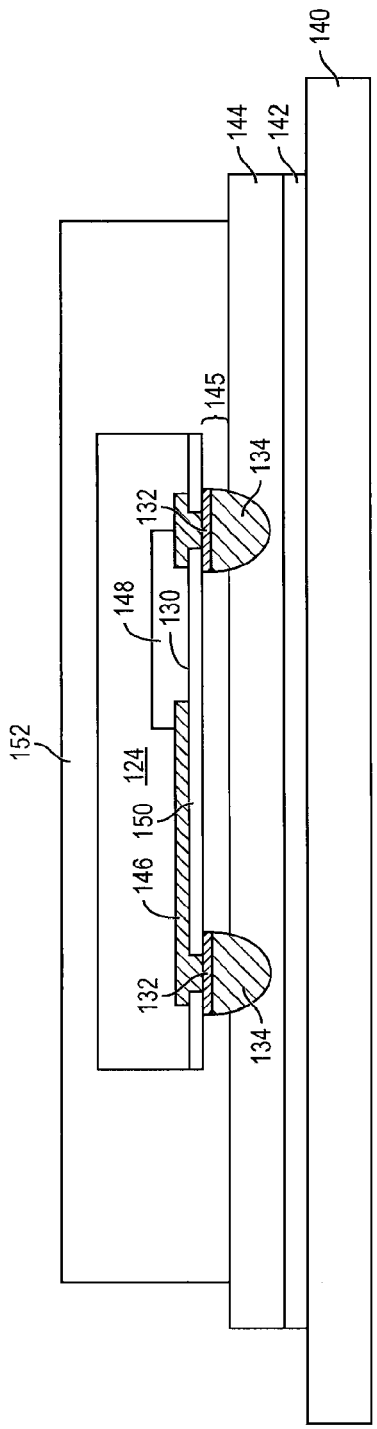

In FIG. 4d, an encapsulant or molding compound 152 is deposited over semiconductor die 124 and adhesive layer 144 using a paste printing, compressive molding, transfer molding, liquid encapsulant molding, vacuum lamination, spin coating, or other suitable applicator. Encapsulant 152 extends between semiconductor die 124 and adhesive layer 144. In one embodiment, encapsulant 152 is injected under pressure from a dispensing needle into gap 145 between semiconductor die 124 and adhesive layer 144 around bumps 134 using a mold underfill (MUF) process. A vacuum assist can draw encapsulant 152 to aid with uniform distribution. Encapsulant 152 can be polymer composite material, such as epoxy resin with filler, epoxy acrylate with filler, or polymer with proper filler. Encapsulant 152 is non-conductive and environmentally protects the semiconductor device from external elements and contaminants. Due to the gap 145 between semiconductor die 124 and adhesive layer 144, the thickness of encapsulant 152 under the semiconductor die 124 is 15-90 micrometers (μm).

Figure 4E:
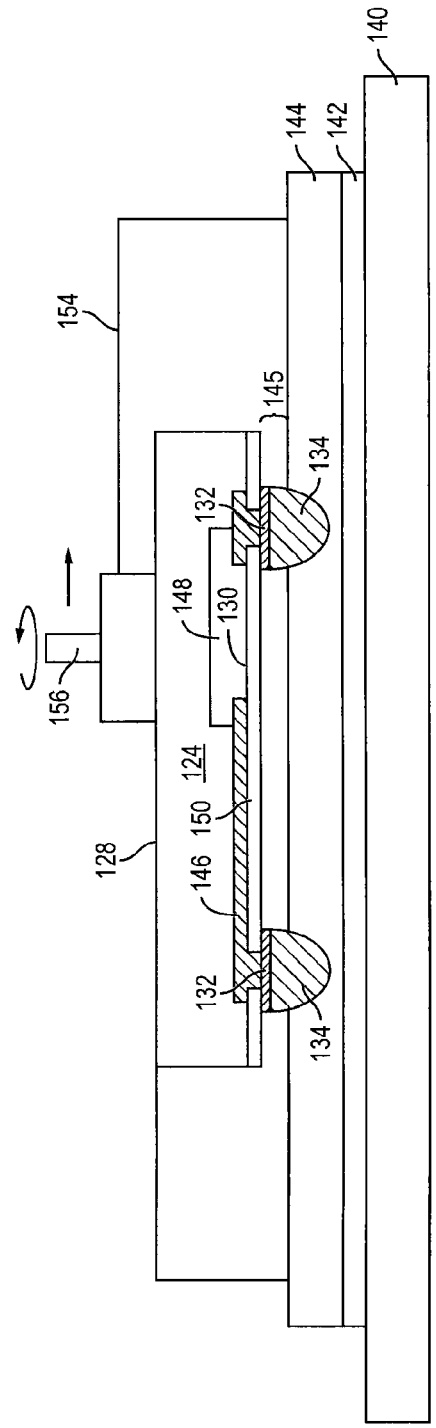

FIG. 4e shows an optional back grinding operation with a portion of surface 154 of encapsulant 152 removed by grinder 156 to planarize the encapsulant and expose back surface 128 of semiconductor die 124 for electrostatic discharge (ESD) control.

In FIG. 4f, carrier 140, interface layer 142, and adhesive layer 144 are removed by chemical etching, mechanical peel-off, CMP, mechanical grinding, thermal bake, laser scanning, or wet stripping to expose bumps 134 from encapsulant 152.

In FIG. 4g, an insulating or dielectric layer 158 is formed over surface 160 of encapsulant 152, opposite surface 154, using PVD, CVD, screen printing, spin coating, spray coating, sintering or thermal oxidation. The insulating layer 158 contains one or more layers of SiO2, Si3N4, SiON, Ta2O5, Al2O3, polyimide, BCB, PBO, or other suitable dielectric material. The insulating layer 158 has a thickness of 5-50 μm. A portion of insulating layer 158 is removed to expose bumps 134.

In FIG. 4h, an electrically conductive layer 162 is conformally applied over insulating layer 158 and exposed bump 134 using a patterning and metal deposition process such as PVD, CVD, sputtering, electrolytic plating, and electroless plating. Conductive layer 162 can be one or more layers of Al, Cu, Sn, Ni, Au, Ag, or other suitable electrically conductive material. Conductive layer 162 can be a seed layer following the contour of insulating layer 158, including into the removed portion of the insulating layer and around exposed bumps 134. In another embodiment, conductive layer 162 is a multi-metal stack with adhesion layer, barrier layer, and seed or wetting layer. The adhesion layer is formed over insulating layer 158 and bumps 134 and can be titanium (Ti), titanium nitride (TiN), titanium tungsten (TiW), Al, or chromium (Cr). The barrier layer is formed over the adhesion layer and can be Ni, NiV, platinum (Pt), palladium (Pd), TiW, or chromium copper (CrCu). The barrier layer inhibits the diffusion of Cu into the active area of the die. The seed layer is formed over the barrier layer and can be Cu, Ni, NiV, Au, or Al.

An insulating or photoresist layer 164 is formed over conductive layer 162. A portion of insulating layer 164 is removed by an etching process to pattern conductive layer 166a-166h. An electrically conductive material is deposited in the removed portions of insulating layer 164 by electrolytic plating, electroless plating, or other suitable metal deposition process. The remaining insulating layer 164 and conductive layer 162 below the insulating layer are removed by an etching process leaving conductive layer 166a-166h as one or more layers of Al, Cu, Sn, Ni, Au, Ag, or other suitable electrically conductive material, as shown in FIG. 4i. Conductive layer 166a-166h can be electrically common or electrically isolated depending on the design and function of semiconductor die 124.

Figure 4J:
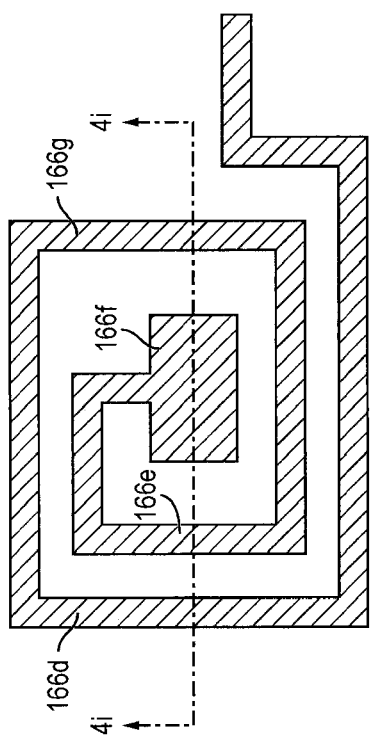

The individual sections of conductive layer 166 can be wound or coiled in plan-view to produce or exhibit inductive properties. For example, conductive layer 166d, 166e, 166f, and 166g constitute wound or spiral inductor wings, as shown in FIG. 4j. The inductor wings 166d-166g are disposed within an interconnect layer partially or completely within a footprint of semiconductor die 124. The inductor wings 166d-166g are electrically connected through conductive layer 162, bump 134, and contact pad 132 to conductive layer 146, which operates as an inductor bridge to electrically connect the inductor wings to analog and digital circuit 148. Due to the thickness of encapsulant 152 under semiconductor die 124 (15-90 μm) and thickness of insulating layer 158 (5-50 μm), inductor wings 166d-166g are separated from semiconductor die 124 by 20-140 μm. In one embodiment, inductor wings 166d-166g are separated from semiconductor die 124 by 100 μm. The gap between inductor wings 166d-166g and semiconductor die 124 reduces eddy current losses and increases Q factor.

Figure 4K:
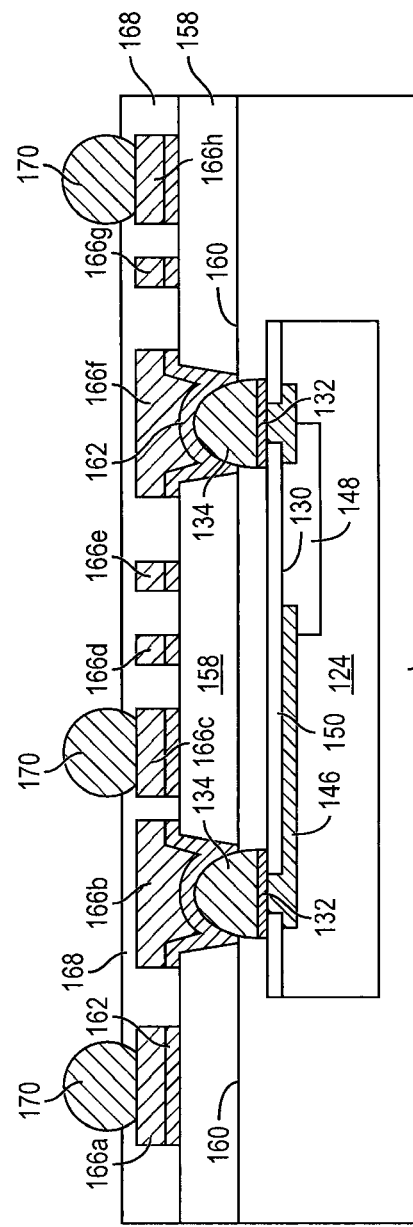

In FIG. 4k, an insulating or passivation layer 168 is formed over insulating layer 158 and conductive layer 166 using PVD, CVD, screen printing, spin coating, spray coating, sintering or thermal oxidation. The insulating layer 168 contains one or more layers of SiO2, Si3N4, SiON, Ta2O5, Al2O3, or other material having similar insulating and structural properties. A portion of insulating layer 168 is removed to expose conductive layer 166a, 166c, and 166h.

An electrically conductive bump material is deposited over the exposed conductive layer 166a, 166c, and 166h using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 166 using a suitable attachment or bonding process. In one embodiment, the bump material is reflowed by heating the material above its melting point to form spherical balls or bumps 170. In some applications, bumps 170 are reflowed a second time to improve electrical contact to conductive layer 166. The bumps can also be compression bonded to conductive layer 166. Bumps 170 represent one type of interconnect structure that can be formed over conductive layer 166. The interconnect structure can also use stud bump, micro bump, or other electrical interconnect.

Figure 5A:
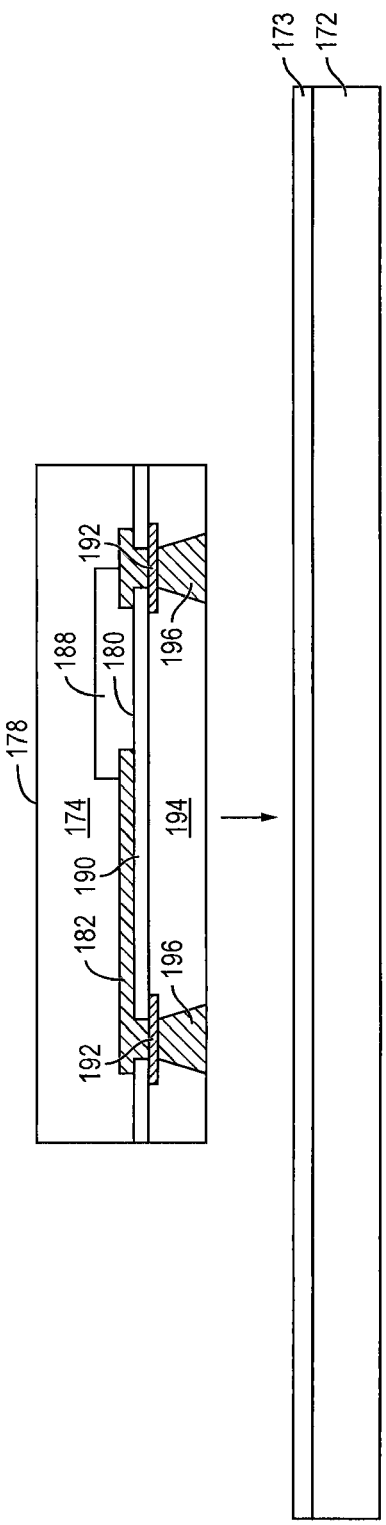

FIGS. 5a-5f show another embodiment with substrate or carrier 172 containing temporary or sacrificial base material such as silicon, polymer, beryllium oxide, or other suitable low-cost, rigid material for structural support. In FIG. 5a, an interface layer or double-sided tape 173 is formed over carrier 172 as a temporary adhesive bonding film or etch-stop layer.

A plurality of semiconductor die 174 is provided in wafer form, similar to FIG. 3a. Each semiconductor die 174 has a back surface 178 and active surface 180 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 180 to implement analog circuits or digital circuits, such as DSP, ASIC, memory, or other signal processing circuit. Semiconductor die 174 may also contain IPDs, such as inductors, capacitors, and resistors, for RF signal processing.

An electrically conductive layer 182 is formed over active surface 180 using PVD, CVD, electrolytic plating, electroless plating process, or other suitable metal deposition process. Conductive layer 182 can be one or more layers of Al, Cu, Sn, Ni, Au, Ag, or other suitable electrically conductive material. Conductive layer 182 is used later as an inductor bridge to analog and digital circuits 188 as part of active surface 180.

An insulating or dielectric layer 190 is formed over active surface 180 and conductive layer 182 of semiconductor die 124 using PVD, CVD, screen printing, spin coating, spray coating, sintering or thermal oxidation. The insulating layer 190 contains one or more layers of SiO2, Si3N4, SiON, Ta2O5, Al2O3, polyimide, BCB, PBO, or other suitable dielectric material.

An electrically conductive layer 192 is formed over insulating layer 190 using PVD, CVD, electrolytic plating, electroless plating process, or other suitable metal deposition process. Conductive layer 192 can be one or more layers of Al, Cu, Sn, Ni, Au, Ag, or other suitable electrically conductive material. Conductive layer 192 is electrically connected to conductive layer 182 and analog and digital circuits 188.

A conductive plug 196 is formed on 192 and 190, by Cu plating, solder ball attach, or wire bonding. An insulating or dielectric layer 194 is formed over insulating layer 190 and conductive layer 192, and expose conductive plug 196, prior to dicing while in wafer form, see FIGS. 3a-3b, using PVD, CVD, screen printing, spin coating, spray coating, lamination, molding, sintering or thermal oxidation. The insulating layer 194 contains one or more layers of SiO2, Si3N4, SiON, Ta2O5, Al2O3, polyimide, BCB, PBO, or other suitable dielectric material. In one embodiment, insulating layer 194 has a thickness of 15-90 μm and contains high resistivity material, such as a polymer material with filler.

Alternatively, a plurality of vias is formed through insulating layer 194 prior to dicing while in wafer form using laser drilling, mechanical drilling, or deep reactive ion etching (DRIE). The vias extend down to conductive layer 192. The vias are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive plug 196. Conductive plugs 196 are electrically connected to conductive layer 192. Conductive layer 192 provides alignment tolerance for conductive plugs 196.

Figure 5B:
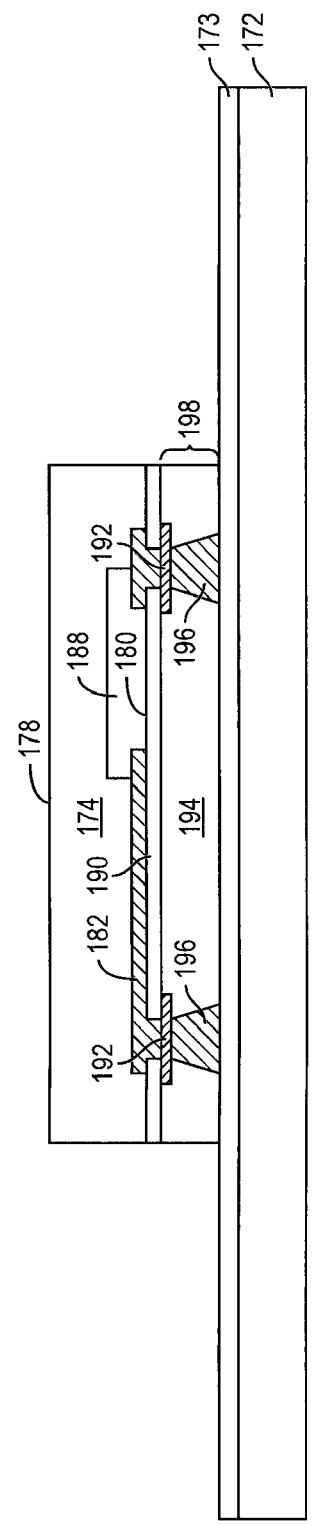

After dicing the semiconductor wafer, similar to FIG. 3c, semiconductor die 174 is positioned over and mounted to carrier 172 and interface layer 173 using a pick and place operation. The insulating layer 194 provides a spacing or separation 198 of 15-90 μm between semiconductor die 174 and interface layer 173, as shown in FIG. 5b.

Figure 5C:
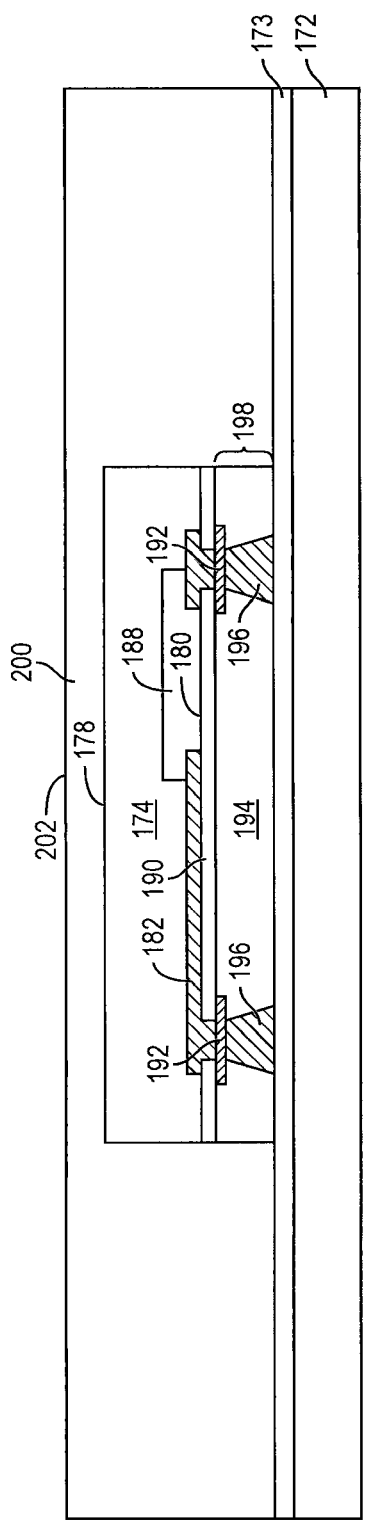

In FIG. 5c, an encapsulant or molding compound 200 is deposited over semiconductor die 174 and interface layer 173 using a paste printing, compressive molding, transfer molding, liquid encapsulant molding, vacuum lamination, spin coating, or other suitable applicator. Encapsulant 200 can be polymer composite material, such as epoxy resin with filler, epoxy acrylate with filler, or polymer with proper filler. Encapsulant 200 is non-conductive and environmentally protects the semiconductor device from external elements and contaminants.

A portion of surface 202 of encapsulant 200 can be removed in an optional back grinding operation, similar to FIG. 4e, to planarize the encapsulant and expose back surface 178 of semiconductor die 174 for ESD control.

Figure 5D:
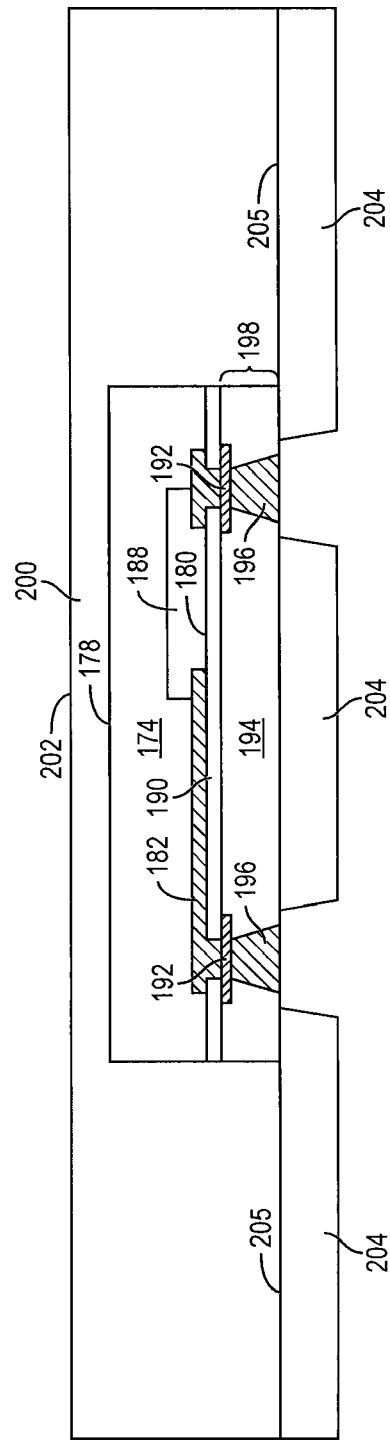

In FIG. 5d, carrier 172 and interface layer 173 are removed by chemical etching, mechanical peel-off, CMP, mechanical grinding, thermal bake, laser scanning, or wet stripping to expose conductive plugs 196.

An insulating or dielectric layer 204 is formed over surface 205 of encapsulant 200, opposite surface 202, using PVD, CVD, screen printing, spin coating, spray coating, sintering or thermal oxidation. The insulating layer 204 contains one or more layers of SiO2, Si3N4, SiON, Ta2O5, Al2O3, polyimide, BCB, PBO, or other suitable dielectric material. The insulating layer 204 has a thickness of 5-50 μm. A portion of insulating layer 204 is removed to expose conductive plugs 196.

In FIG. 5e, an electrically conductive layer 206 is formed over insulating layer 204 as segments 206a-206h by electrolytic plating, electroless plating, or other suitable metal deposition process. Conductive layer 206a-206h contains one or more layers of Al, Cu, Sn, Ni, Au, Ag, or other suitable electrically conductive material. Conductive layer 206a-206h can be electrically common or electrically isolated depending on the design and function of semiconductor die 174.

The individual sections of conductive layer 206 can be wound or coiled in plan-view to produce or exhibit inductive properties. For example, conductive layer 206d, 206e, 206f, and 206g constitute wound or spiral inductor wings, similar to FIG. 4j. The inductor wings 206d-206g are disposed within an interconnect layer partially or completely within a footprint of semiconductor die 174. The inductor wings 206d-206g are electrically connected through conductive plugs 196 and conductive layer 192 to conductive layer 182, which operates as an inductor bridge to electrically connect the inductor wings to analog and digital circuits 188. Due to the thickness of insulating layer 194 (15-90 μm) and thickness of insulating layer 204 (5-50 μm), inductor wings 206d-206g are separated from semiconductor die 174 by 20-140 μm. In one embodiment, inductor wings 206d-206g are separated from semiconductor die 174 by 100 μm. The separation between inductor wings 206d-206g and semiconductor die 174 reduces eddy current losses and increases Q factor.

In FIG. 5f, an insulating or passivation layer 208 is formed over insulating layer 204 and conductive layer 206 using PVD, CVD, screen printing, spin coating, spray coating, sintering or thermal oxidation. The insulating layer 208 contains one or more layers of SiO2, Si3N4, SiON, Ta2O5, Al2O3, or other material having similar insulating and structural properties. A portion of insulating layer 208 is removed to expose conductive layer 206a, 206c, and 206h.

An electrically conductive bump material is deposited over the exposed conductive layer 206a, 206c, and 206h using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 206 using a suitable attachment or bonding process. In one embodiment, the bump material is reflowed by heating the material above its melting point to form spherical balls or bumps 210. In some applications, bumps 210 are reflowed a second time to improve electrical contact to conductive layer 206. The bumps can also be compression bonded to conductive layer 206. Bumps 210 represent one type of interconnect structure that can be formed over conductive layer 206. The interconnect structure can also use stud bump, micro bump, or other electrical interconnect.

Figure 6C:
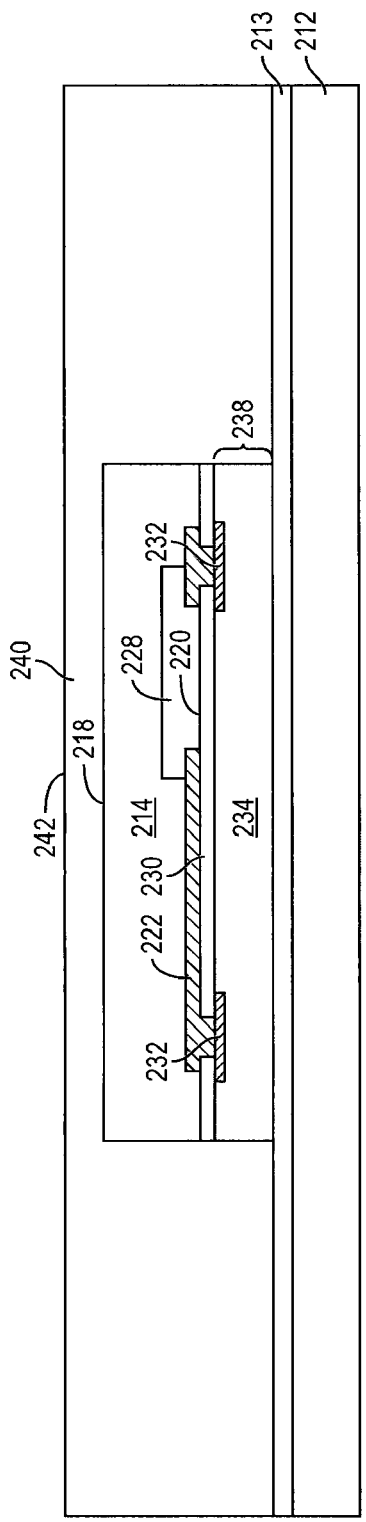

FIGS. 6a-6g show another embodiment with substrate or carrier 212 contains temporary or sacrificial base material such as silicon, polymer, beryllium oxide, or other suitable low-cost, rigid material for structural support. In FIG. 6a, an interface layer or double-sided tape 213 is formed over carrier 212 as a temporary adhesive bonding film or etch-stop layer.

A plurality of semiconductor die 214 is provided in wafer form, similar to FIG. 3a. Each semiconductor die 214 has a back surface 218 and active surface 220 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 220 to implement analog circuits or digital circuits, such as DSP, ASIC, memory, or other signal processing circuit. Semiconductor die 214 may also contain IPDs, such as inductors, capacitors, and resistors, for RF signal processing.

An electrically conductive layer 222 is formed over active surface 220 using PVD, CVD, electrolytic plating, electroless plating process, or other suitable metal deposition process. Conductive layer 222 can be one or more layers of Al, Cu, Sn, Ni, Au, Ag, or other suitable electrically conductive material. Conductive layer 222 is used later as an inductor bridge to analog and digital circuits 228 as part of active surface 220.

An insulating or dielectric layer 230 is formed over active surface 220 and conductive layer 222 of semiconductor die 214 using PVD, CVD, screen printing, spin coating, spray coating, sintering or thermal oxidation. The insulating layer 230 contains one or more layers of SiO2, Si3N4, SiON, Ta2O5, Al2O3, polyimide, BCB, PBO, or other suitable dielectric material.

An electrically conductive layer 232 is formed over insulating layer 230 using PVD, CVD, electrolytic plating, electroless plating process, or other suitable metal deposition process. Conductive layer 232 can be one or more layers of Al, Cu, Sn, Ni, Au, Ag, or other suitable electrically conductive material. Conductive layer 232 is electrically connected to conductive layer 222.

A sacrificial layer 234 is formed over insulating layer 230 and conductive layer 232 prior to dicing while in wafer form, see FIG. 3a-3b. The sacrificial layer 234 contains one or more layers of dry film and back grinding tape, liquid photo resist, or protection paste. In one embodiment, the thickness of insulating layer 234 is 15-90 μm.

After dicing the semiconductor wafer, similar to FIG. 3c, semiconductor die 214 is positioned over and mounted to carrier 212 and interface layer 213 using a pick and place operation. The sacrificial layer 234 provides a spacing or separation 238 of 15-90 μm between semiconductor die 214 and interface layer 213, as shown in FIG. 6b.

In FIG. 6c, an encapsulant or molding compound 240 is deposited over semiconductor die 214 and interface layer 213 using a paste printing, compressive molding, transfer molding, liquid encapsulant molding, vacuum lamination, spin coating, or other suitable applicator. Encapsulant 240 can be polymer composite material, such as epoxy resin with filler, epoxy acrylate with filler, or polymer with proper filler. Encapsulant 240 is non-conductive and environmentally protects the semiconductor device from external elements and contaminants.

A portion of surface 242 of encapsulant 240 can be removed in an optional back grinding operation, similar to FIG. 4e, to planarize the encapsulant and expose back surface 218 of semiconductor die 214 for ESD control.

Figure 6D:
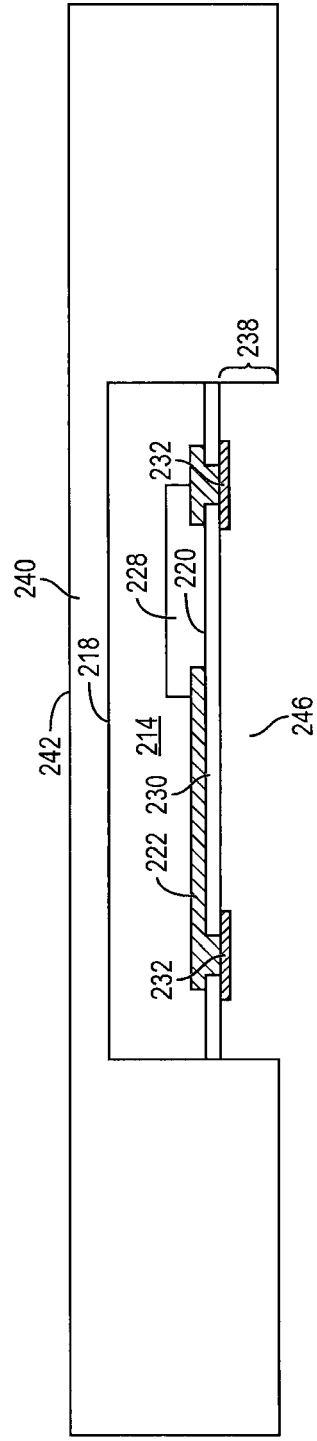

In FIG. 6d, carrier 212, interface layer 213, and sacrificial layer 234 are removed by chemical etching, mechanical peel-off, CMP, mechanical grinding, thermal bake, laser scanning, or wet stripping leaving cavity 246 under semiconductor die 214.

In FIG. 6e, an insulating or dielectric layer 252 is formed over surface 254 of encapsulant 240, opposite surface 242, and into cavity 246 using PVD, CVD, screen printing, spin coating, spray coating, sintering or thermal oxidation. The insulating layer 252 contains one or more layers of SiO2, Si3N4, SiON, Ta2O5, Al2O3, polyimide, BCB, PBO, or other suitable dielectric material. In one embodiment, insulating layer 252 is deposited as a single or double layer dielectric material. The insulating layer 252 has a thickness of 5-50 μm. A portion of insulating layer 252 is removed to expose conductive layer 232.

In FIG. 6f, an electrically conductive layer 256 is formed over insulating layer 252 as segments 256a-256h by electrolytic plating, electroless plating, or other suitable metal deposition process. Conductive layer 256a-256h contains one or more layers of Al, Cu, Sn, Ni, Au, Ag, or other suitable electrically conductive material. For example, conductive layer 256 may include a seed layer of Ti/Cu or TiW/Cu with selective Cu plating followed by seed layer wet etching. Conductive layer 256b and 256f extends into the removed portion of insulating layer 252 to contact conductive layer 232. Conductive layer 256a-256h can be electrically common or electrically isolated depending on the design and function of semiconductor die 214.

The individual sections of conductive layer 256 can be wound or coiled in plan-view to produce or exhibit inductive properties. For example, conductive layer 256d, 256e, 256f, and 256g constitute wound or spiral inductor wings, similar to FIG. 4j. The inductor wings 256d-256g are disposed within an interconnect layer partially or completely within a footprint of semiconductor die 214. The inductor wings 256d-256g are electrically connected through conductive layer 232 to conductive layer 222, which operates as an inductor bridge to electrically connect the inductor wings to analog and digital circuits 228. Due to the thickness of thickness of insulating layer 252, inductor wings 256d-256g are separated from semiconductor die 214 by 25-160 μm. In one embodiment, inductor wings 256d-256g are separated from semiconductor die 214 by 120 μm. The separation between inductor wings 256d-256g and semiconductor die 214 reduces eddy current losses and increases Q factor.

Figure 6G:
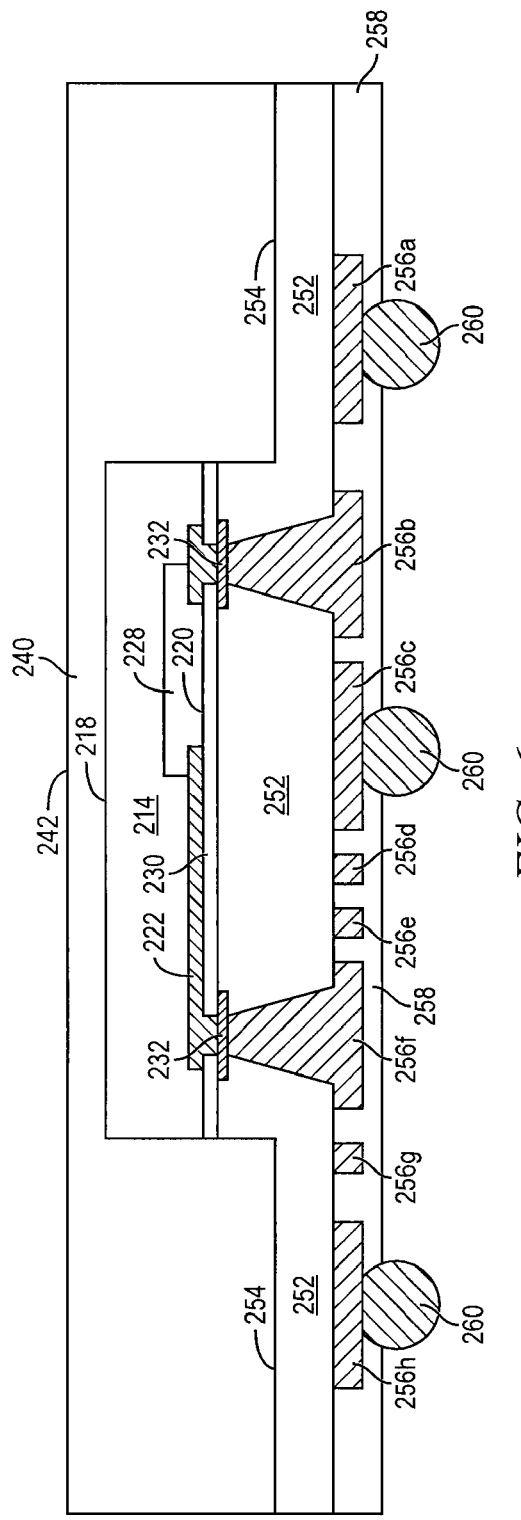

In FIG. 6g, an insulating or passivation layer 258 is formed over insulating layer 252 and conductive layer 256 using PVD, CVD, screen printing, spin coating, spray coating, sintering or thermal oxidation. The insulating layer 258 contains one or more layers of SiO2, Si3N4, SiON, Ta2O5, Al2O3, or other material having similar insulating and structural properties. A portion of insulating layer 258 is removed to expose conductive layer 256a, 256c, and 256h.

An electrically conductive bump material is deposited over the exposed conductive layer 256a, 256c, and 256h using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 256 using a suitable attachment or bonding process. In one embodiment, the bump material is reflowed by heating the material above its melting point to form spherical balls or bumps 260. In some applications, bumps 260 are reflowed a second time to improve electrical contact to conductive layer 256. The bumps can also be compression bonded to conductive layer 256. Bumps 260 represent one type of interconnect structure that can be formed over conductive layer 256. The interconnect structure can also use stud bump, micro bump, or other electrical interconnect.

Figure 7A:
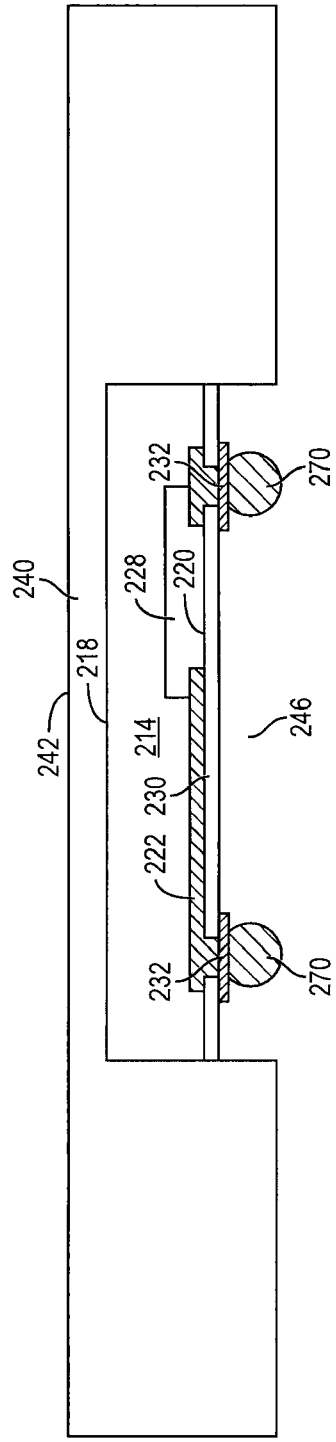

FIGS. 7a-7e shows another embodiment, continuing from FIG. 6d, with cavity 246 exposing semiconductor die 214 by stripping sacrificial protection layer 234. An electrically conductive bump material is deposited over the exposed conductive layer 232 within cavity 246 while in wafer form using an evaporation, electrolytic plating, electroless plating, ball drop, or screen printing process, as shown in FIG. 7a. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 232 using a suitable attachment or bonding process. In one embodiment, the bump material is reflowed by heating the material above its melting point to form spherical balls or bumps 270. In some applications, bumps 270 are reflowed a second time to improve electrical contact to conductive layer 232. The bumps can also be compression bonded to conductive layer 232. Bumps 270 represent one type of interconnect structure that can be formed over conductive layer 232. The interconnect structure can also use stud bump, micro bump, or other electrical interconnect.

Figure 7B:
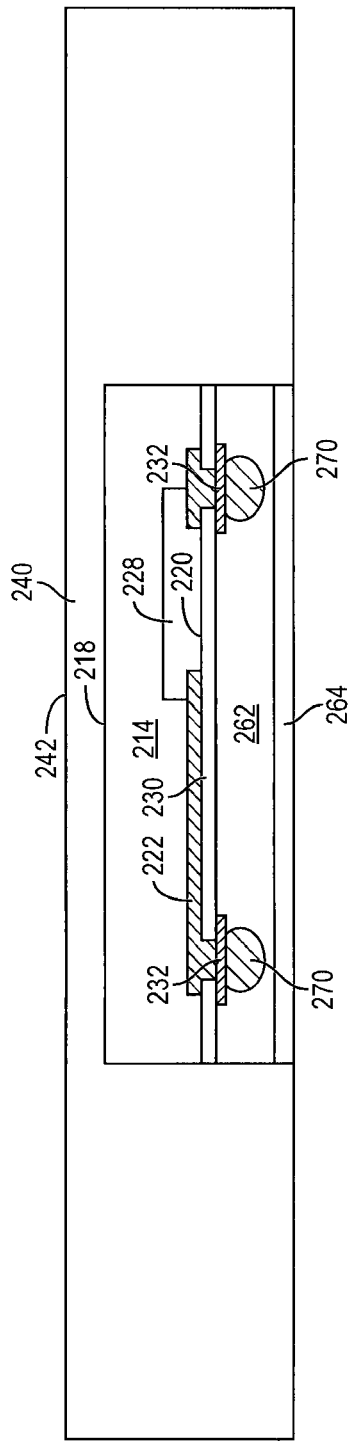

FIG. 7b shows an embodiment with backgrinding tape 262 and protection liner 264 formed over bumps 270 and insulating layer 230 while in wafer form. In one embodiment, tape 262 can be a thermal resistant resin. The backgrinding tape 262 and protection liner 264 provide structural support during backgrinding and dicing operations, such as shown in FIGS. 3c and 4e.

Figure 7C:
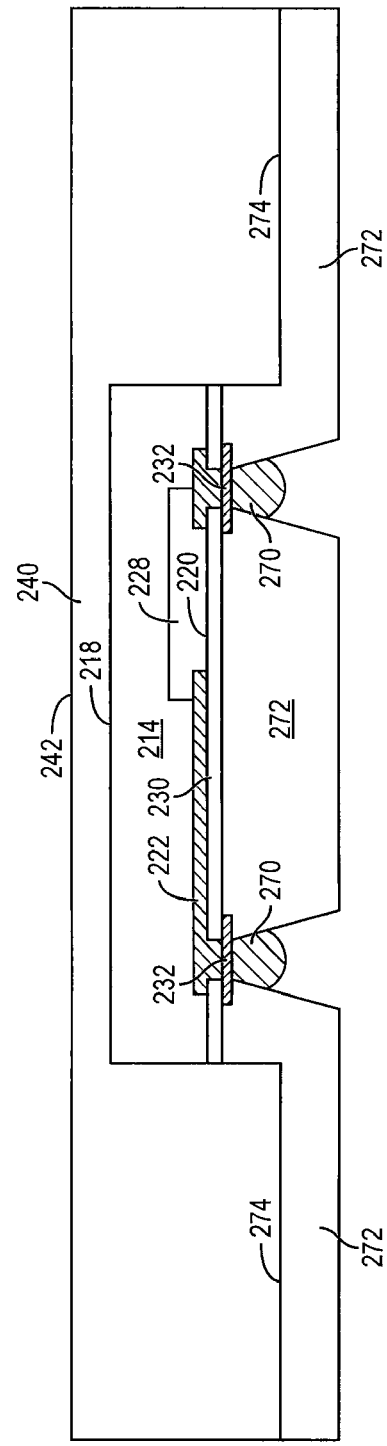

In FIG. 7c, an insulating or dielectric layer 272 is formed over surface 274 of encapsulant 240, opposite surface 242, and into cavity 246 over bumps 270 using PVD, CVD, screen printing, spin coating, spray coating, sintering or thermal oxidation. The insulating layer 272 contains one or more layers of SiO2, Si3N4, SiON, Ta2O5, Al2O3, polyimide, BCB, PBO, or other suitable dielectric material. In one embodiment, insulating layer 272 is deposited as a single or double layer dielectric material. The insulating layer 272 has a thickness of 5-50 μm. A portion of insulating layer 272 is removed to expose bumps 270.

In FIG. 7d, an electrically conductive layer 276 is formed over insulating layer 272 as segments 276a-276h by electrolytic plating, electroless plating, or other suitable metal deposition process. Conductive layer 276a-276h contains one or more layers of Al, Cu, Sn, Ni, Au, Ag, or other suitable electrically conductive material. For example, conductive layer 276 may include a seed layer of Ti/Cu or TiW/Cu with selective Cu plating followed by seed layer wet etching. Conductive layer 276b and 276f extends into the removed portion of insulating layer 272 to contact bumps 270. Conductive layer 276a-276h can be electrically common or electrically isolated depending on the design and function of semiconductor die 214.

The individual sections of conductive layer 276 can be wound or coiled in plan-view to produce or exhibit inductive properties. For example, conductive layer 276d, 276e, 276f, and 276g constitute wound or spiral inductor wings, similar to FIG. 4j. The inductor wings 276d-276g are disposed within an interconnect layer partially or completely within a footprint of semiconductor die 214. The inductor wings 276d-276g are electrically connected through bumps 270 and conductive layer 232 to conductive layer 222, which operates as an inductor bridge to electrically connect the inductor wings to analog and digital circuits 228. Due to the thickness of insulating layer 272, inductor wings 276d-276g are separated from semiconductor die 214 by 25-160 μm. In one embodiment, inductor wings 276d-276g are separated from semiconductor die 214 by 120 μm. The separation between inductor wings 276d-276g and semiconductor die 214 reduces eddy current losses and increases Q factor.

In FIG. 7e, an insulating or passivation layer 278 is formed over insulating layer 272 and conductive layer 276 using PVD, CVD, screen printing, spin coating, spray coating, sintering or thermal oxidation. The insulating layer 278 contains one or more layers of SiO2, Si3N4, SiON, Ta2O5, Al2O3, or other material having similar insulating and structural properties. A portion of insulating layer 278 is removed to expose conductive layer 276a, 276c, and 276h.

An electrically conductive bump material is deposited over the exposed conductive layer 276a, 276c, and 276h using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 276 using a suitable attachment or bonding process. In one embodiment, the bump material is reflowed by heating the material above its melting point to form spherical balls or bumps 280. In some applications, bumps 280 are reflowed a second time to improve electrical contact to conductive layer 276. The bumps can also be compression bonded to conductive layer 276. Bumps 280 represent one type of interconnect structure that can be formed over conductive layer 276. The interconnect structure can also use stud bump, micro bump, or other electrical interconnect.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a carrier;
    forming an adhesive layer over the carrier;
    providing a semiconductor die having a plurality of bumps formed over an active surface of the semiconductor die;
    mounting the semiconductor die to the carrier with the bumps partially disposed in the adhesive layer to form a gap between the semiconductor die and adhesive layer;
    depositing an encapsulant over the semiconductor die and within the gap between the semiconductor die and adhesive layer;
    removing the carrier and adhesive layer to expose the bumps from the encapsulant;
    forming an insulating layer over the encapsulant; and
    forming a first conductive layer over the insulating layer in a wound configuration to exhibit inductive properties and electrically connected to the bumps, the first conductive layer having a separation from the semiconductor die as determined by the encapsulant within the gap and the insulating layer.

2. The method of claim 1, wherein providing the semiconductor die includes:
    forming circuits on the active surface of the semiconductor die; and
    forming a second conductive layer over the active surface electrically connecting the first conductive layer and the circuits.

3. The method of claim 1, further including:
    removing a portion of the insulating layer to expose the bumps; and
    forming a second conductive layer over the insulating layer and bumps prior to forming the first conductive layer, the second conductive layer following a contour of the insulating layer and bumps.

4. The method of claim 1, wherein the first conductive layer is separated from the semiconductor die by 20-140 micrometers.

5. The method of claim 1, further including forming an interconnect structure over the insulating layer.

6. The method of claim 1, wherein the first conductive layer is partially disposed within a footprint of the semiconductor die.

7. A method of making a semiconductor device, comprising:
    providing a semiconductor die;
    forming a first insulating layer over a surface of the semiconductor die;
    depositing an encapsulant over the semiconductor die;
    forming a second insulating layer over the first insulating layer and encapsulant; and
    forming a first conductive layer over the second insulating layer in a wound configuration to exhibit inductive properties with the first conductive layer being separated from the semiconductor die by the first and second insulating layers.

8. The method of claim 7, wherein providing the semiconductor die includes:
    forming circuits on the surface of the semiconductor die; and
    forming a second conductive layer over the surface of the semiconductor die electrically connecting the first conductive layer and the circuits.

9. The method of claim 7, wherein the first conductive layer is separated from the semiconductor die by 20-140 micrometers.

10. The method of claim 7, wherein the first conductive layer is partially disposed within a footprint of the semiconductor die.

11. The method of claim 7, further including forming a plurality of conductive vias through the first insulating layer.

12. The method of claim 7, further including forming an interconnect structure over the second insulating layer.

13. A method of making a semiconductor device, comprising:
    providing a semiconductor die;
    forming a first insulating layer over a first surface of the semiconductor die;
    depositing an encapsulant over a second surface of the semiconductor die opposite the first surface;
    forming a second insulating layer over the first surface of the semiconductor die; and
    forming a first conductive layer over the second insulating layer in a wound configuration to exhibit inductive properties, the first conductive layer having a separation from the semiconductor die.

14. The method of claim 13, wherein providing the semiconductor die includes:
    forming circuits on the first surface of the semiconductor die; and
    forming a second conductive layer over the first surface of the semiconductor die electrically connecting the first conductive layer and the circuits.

15. The method of claim 13, wherein the first conductive layer is separated from the semiconductor die by 20-140 micrometers.

16. The method of claim 13, wherein the first conductive layer is partially disposed within a footprint of the semiconductor die.

17. The method of claim 13, further including:
    removing the first insulating layer prior to forming the second insulating layer; and
    forming a plurality of conductive vias through the second insulating layer.

18. The method of claim 13, further including forming a plurality of conductive vias through the first insulating layer.

19. The method of claim 13, further including forming an interconnect structure over the second insulating layer.

20. A semiconductor device, comprising:
    a semiconductor die;
    a first insulating layer formed over a first surface of the semiconductor die;
    an encapsulant deposited over a second surface of the semiconductor die opposite the first surface;
    a second insulating layer formed over the first surface of the semiconductor die; and a first conductive layer formed over the second insulating layer in a wound configuration to exhibit inductive properties, the first conductive layer having a separation from the semiconductor die.

21. The semiconductor device of claim 20, wherein the first conductive layer is separated from the semiconductor die by 20-140 micrometers.

22. The semiconductor device of claim 20, wherein the first conductive layer is partially disposed within a footprint of the semiconductor die.

23. The semiconductor device of claim 20, further including a plurality of conductive vias formed through the first insulating layer.

24. The semiconductor device of claim 20, further including an interconnect structure formed over the second insulating layer.

* * * * *